United States Patent
Hartmann

(10) Patent No.: US 8,486,810 B2
(45) Date of Patent: Jul. 16, 2013

(54) METHOD FOR FABRICATING A SUBSTRATE PROVIDED WITH TWO ACTIVE AREAS WITH DIFFERENT SEMICONDUCTOR MATERIALS

(75) Inventor: Jean-Michel Hartmann, Le Versoud (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 13/280,694

(22) Filed: Oct. 25, 2011

(65) Prior Publication Data
US 2012/0108019 A1    May 3, 2012

(30) Foreign Application Priority Data
Oct. 27, 2010  (FR) ...................... 10 04222

(51) Int. Cl.
*H01L 21/20*    (2006.01)
*H01L 21/36*    (2006.01)

(52) U.S. Cl.
USPC ............ 438/478; 257/369; 438/221; 438/481

(58) Field of Classification Search
USPC ................... 257/77, 190, 194, 255, 350, 379, 257/627; 438/154, 221, 481, 478
See application file for complete search history.

(56) References Cited

U.S. PATENT DOCUMENTS

| | | | |
|---|---|---|---|
| 2003/0006415 A1* | 1/2003 | Yokogawa et al. | 257/77 |
| 2007/0252216 A1 | 11/2007 | Muhammad | |
| 2009/0212329 A1* | 8/2009 | Ieong et al. | 257/255 |

OTHER PUBLICATIONS

Bera, L.K. et al., "A Dual-Strained CMOS Structure Through Simultaneous Formation of Relaxed and Compressive Strained-SiGe-on-Insulator," *IEEE Electron Device Letters*, May 2006, pp. 350-353, vol. 27, No. 5.

Tezuka, T. et al., "Strain Analysis in Ultrathin SiGe-on-insulator Layers Formed From Strained Si-on-insulator Substrates by Ge-condensation Process," *Applied Physics Letters*, 2007, pp. 181918-1-181918-3, vol. 90.

Jurczak, M. et al., "Silicon-on-Nothing (SON)-an Innovative Process for Advanced CMOS," *IEEE Transactions on Electron Devices*, Nov. 2000, pp. 2179-2187, vol. 47, No. 11.

* cited by examiner

*Primary Examiner* — Kimberly Rizkallah
*Assistant Examiner* — Errol Fernandes
(74) *Attorney, Agent, or Firm* — Oliff & Berridge, PLC

(57) ABSTRACT

A layer of second semiconductor material is deposited on the layer of first semiconductor material of a substrate. Two active areas are then defined by means of selective elimination of the first and second semiconductor materials. One of the two active areas is then covered by a protective material. The layer of second semiconductor material is then eliminated by means of selective elimination of material. A first active area comprising a main surface made from a first semiconductor material, and a second active area comprising a main surface made from second semiconductor material are thus obtained.

8 Claims, 6 Drawing Sheets

METHOD FOR FABRICATING A SUBSTRATE PROVIDED WITH TWO ACTIVE AREAS WITH DIFFERENT SEMICONDUCTOR MATERIALS

BACKGROUND OF THE INVENTION

The invention relates to a method for fabricating a substrate comprising a first active area provided with a main surface made from a first semi-conductor material, and a second active area provided with a main surface made from a second semiconductor material different from the first semi-conductor material.

STATE OF THE ART

A MOS transistor (MOS for Metal Oxide Semiconductor) is formed by two charge carrier reservoirs: the source and drain, which are separated by a potential barrier formed by the channel. This area is controlled by a gate with a length which can vary from several nanometers to several tens of nanometers. The gate is separated from the channel by a gate dielectric.

In order to increase the integration density in microelectronic devices, it is constantly sought to reduce the critical dimensions of the transistors. When this dimension is very small, for example about a few nanometers or tens of nanometers, electrostatic control of the channel is sometimes no longer ensured and control of the gate can be impaired: these are short-channel effects.

In order to continue to increase the integration density, a first path for improvement consists in using a SOI substrate (SOI for silicon on insulator). This particular architecture enables the electric insulation of the transistor to be better controlled by insulating the active semiconducting layer from the support substrate.

A second path for improvement consists in introducing germanium into the channel. Germanium, which presents the same crystalline structure as silicon, enables the electric performances of the transistors to be improved by offering a better mobility of the charge carriers especially in pMOS transistors. Indeed, pure germanium presents a mobility that is twice as high for the electrons and four times as high for the holes than silicon.

In order to profit from the advantages of SOI substrates and of germanium, the microelectronics industry has implemented co-integration methods on SOI substrates. In these substrates, certain transistors (pMOS) have channels made from silicon-germanium alloy (Site) and other transistors (nMOS) have channels made from silicon. It is interesting to have at disposal a substrate which comprises the two types of semiconductor materials.

A conventional co-integration method is illustrated in FIGS. 1 to 4. FIG. 1 schematically illustrates, in cross-section, an initial substrate of SOI type which comprises a film made from first semiconductor material, $Sc_1$, here silicon, arranged on the layer of electrical insulator 2, here silicon oxide ($SiO_2$), which is itself arranged on a mechanical support 3, here made from silicon.

As illustrated in FIG. 2, the SOI substrate is then etched so as to obtain several silicon pads 4 which will form the future active areas of the transistors. Silicon pads 4 have different sizes so that they can perform different functions.

After silicon pads 4 have been formed and as illustrated in FIG. 3, a part of pads 4 is covered by a silicon oxide film 5 which enables differentiation of pads 4.

As illustrated in FIG. 4, a film of silicon-germanium alloy $Sc_2$ is then deposited on the silicon pads $Sc_1$ uncovered by means of selective epitaxy. The selective epitaxy is performed by means of chlorinated chemistry based on a mixture of dichlorosilane ($SiH_2Cl_2$), germane ($GeH_4$) and hydrochloric acid (HCl).

Selective epitaxy enables the silicon-germanium film to be deposited only in the required areas. It is then necessary to leave the areas where growth is sought for uncovered and to cover the areas to be protected by a silicon oxide or nitride.

Selective epitaxy is a technique that is difficult to implement on account of the large number of factors that have to be taken into consideration when performing it. Furthermore, selective epitaxy gives rise to several technological problems related in particular to charge effects and to the formation of "crystallographic facets".

Charge effects occur during selective epitaxy in chlorinated chemistry and result in fluctuations of the growth rate and the germanium concentration. Charge effects are mainly linked to the quantity of active surface present at the surface of the substrate and to the distribution of these active surfaces on the substrate. Indeed, the same growth method used for different circuits will give different thicknesses and concentrations in so far as the quantity of uncovered silicon is different between the two circuits. Furthermore, between small and large open areas, fluctuations in thickness and in germanium content occur in the silicon-germanium layers of one and the same circuit. It is therefore impossible to guarantee homogeneity of the properties (thickness, germanium concentration and morphology) of the layers deposited by selective epitaxy on silicon pads of different sizes.

Non-homogeneity of the layers deposited by selective epitaxy proves detrimental for the subsequent technological integration steps. Indeed, the differences in thickness between the active areas are detrimental in particular for the technological step of lithography. The germanium concentration fluctuations are for example the cause of a variability in the electric properties of the transistors.

Another problem arises in the course of selective epitaxy. It is linked to the reduction of the effective surface of the active areas caused by the formation of "crystallographic facets" from the edges of the active areas. When growth takes place, parasite lateral surfaces in given crystallographic planes are formed and reduce the effective surface of the active area, which increases integration constraints.

After the silicon-germanium alloy $Sc_2$ has been deposited by epitaxy on the silicon film $Sc_1$, silicon oxide 5 which protected pads 4 is eliminated by a wet chemical method. The substrate obtained thus comprises pads 4a made from silicon and pads 4b with a stack (SiGe/Si). The substrates obtained are subsequently used in conventional MOS transistor integration methods.

OBJECT OF THE INVENTION

The object of the invention is to provide a method for producing a substrate comprising two active areas with different semiconductor materials that is easy to implement and that reduces the technological constraints on the active area formed by epitaxy.

According to the invention, this object is achieved by the fact that the method successively comprises, using a substrate provided with a layer made from a first semiconductor material:
  deposition by epitaxy of a layer made from a second semiconductor material;

etching of the substrate to form the first and second active areas each comprising a stack of first and second semiconductor materials;

covering the second active area with a protective material;

eliminating the layer of second semiconductor material of the first active area so as to obtain a first active area comprising a main surface made from first semiconductor material, and a second active area comprising a main surface made from second semiconductor material different from the first semiconductor material.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
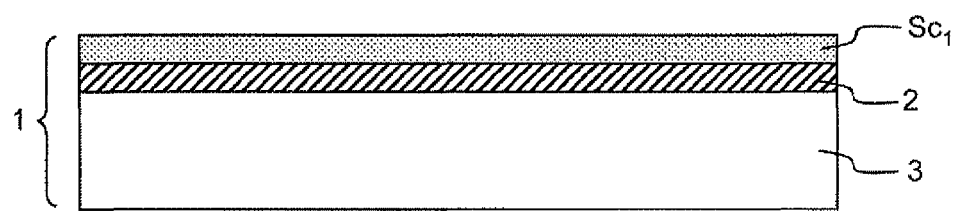
FIGS. 1 to 4 schematically represent, in cross-section, successive steps of an embodiment of a method according to the prior art, FIGS. 5 to 8 schematically represent, in cross-section, successive steps of an embodiment of a method according to the invention, FIG. 9 schematically represents, in cross-section, an alternative embodiment of a method according to the invention.
Figure 2:
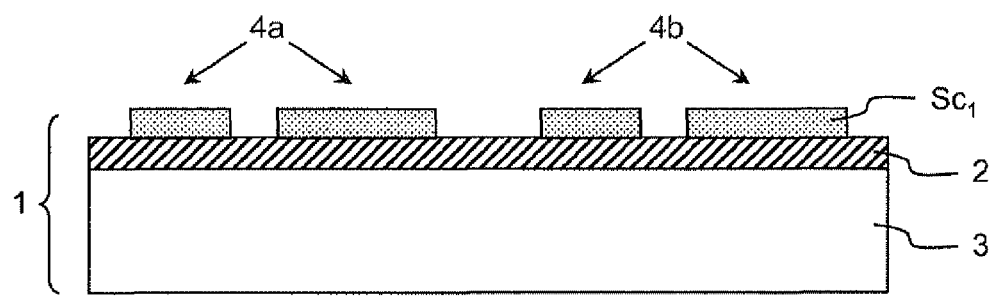
Figure 3:
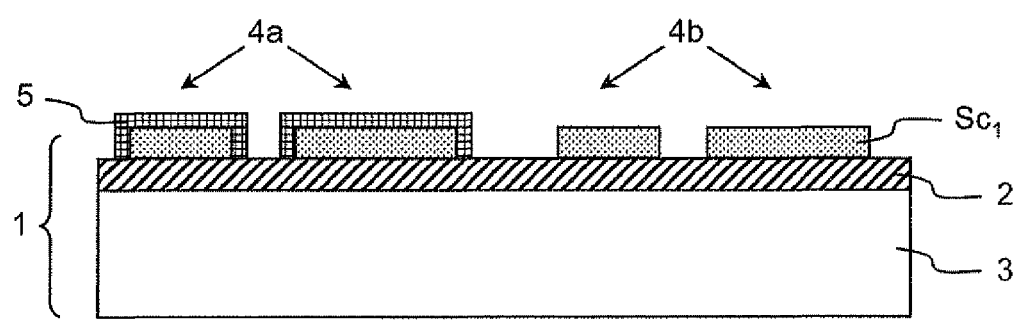
Figure 4:
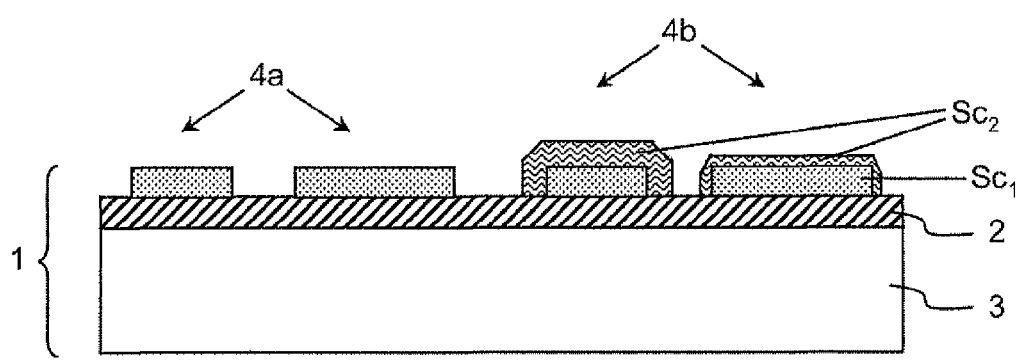

FIG. 1 schematically illustrates, in cross-section, an initial substrate 1 which comprises at least one layer made from a first single-crystal semi-conductor material $Sc_1$ arranged at the surface of a support substrate 3. Initial substrate 1 can also comprise additional layers made from semi-conductor materials and layers of different nature.

Substrate 1 can be of bulk type made from silicon, germanium, or any other semiconductor material. Substrate 1 can also be of semiconductor on insulator type. In this case, as illustrated in FIG. 1, initial substrate 1 can comprise a mechanical support layer 3 and a layer of electrically insulating material 2. The layer made from first semiconductor material $Sc_1$ is separated from mechanical support layer 3 by the layer of electrically insulating material 2. According to this configuration, first semiconductor material $Sc_1$ can be identical to that of mechanical support layer 3 or be a different material. Semiconductor material $Sc_1$ and mechanical support layer 3 can also have the same crystallographic orientation or different orientations.

If initial substrate 1 is a bulk substrate, the layer of first semiconductor material $Sc_1$ is formed by a surface area of mechanical support layer 3. The layer of first semiconductor material $Sc_1$ is thereby formed by the same material as that of mechanical support layer 3. As a variant, the layer of first semiconductor material $Sc_1$ can also be formed at the surface of mechanical support layer 3, and be made from a different material.

Substrate 1 is preferably of semiconductor on insulator type. For example purposes, first semiconductor material $Sc_1$ can have a base of doped or intrinsic, relaxed or strained silicon, germanium, or silicon-germanium alloy. First semiconductor material $Sc_1$ is preferably silicon. The layer of electrically insulating material is for example silicon oxide ($SiO_2$). It can also be formed by a stack comprising several electrically insulating materials.

Figure 5:
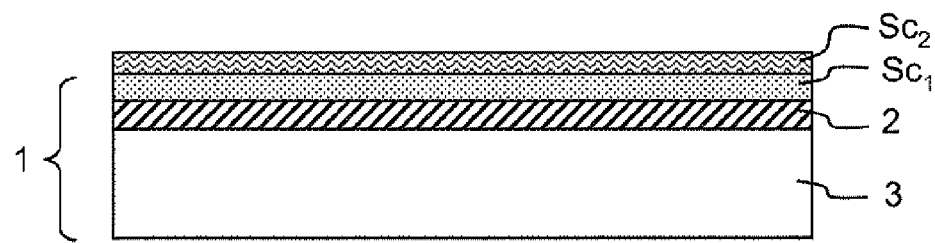

As illustrated in FIG. 5, at least one layer of second semiconductor material $Sc_2$ is deposited on the layer of first semiconductor material $Sc_1$. Deposition is performed "full wafer" by means of epitaxy, which enables charge effects and "crystallographic facets" to be circumvented or reduced. Deposition by epitaxy enables the crystal lattice of the layer of first semiconductor material $Sc_1$ to be extended by the layer of second semiconductor material $Sc_2$. Epitaxy is preferably formed by means of a chemistry called "non-selective", i.e. that is deposited simultaneously on all the materials present. If semiconductor material $Sc_2$ is a silicon-germanium alloy, non-selective epitaxy is preferably performed by a hydrogenated chemistry base comprising for example silane ($SiH_4$) and germane ($GeH_4$). Other gaseous or liquid silicon and germanium precursors can be used, for example disilane ($Si_2H_6$), trisilane ($Si_3H_8$) or digermane ($Ge_2H_6$). In a preferred embodiment, the layer of first semi-conductor material $Sc_1$ covers the whole of the main surface of the substrate and it is single-crystal. This results in second semiconductor material $Sc_2$ also being single-crystal and covering the whole of the main surface of the substrate.

As there is only one material with a single crystalline phase at the surface of the substrate, the same reaction takes place on the substrate and there is no charge effect phenomenon. Epitaxy is preferably performed by chemical vapor deposition, advantageously at a pressure comprise between one hundredth and one atmosphere. If material $Sc_2$ is a silicon-germanium alloy, a chlorinated chemistry (with for example dichlorosilane ($SiH_2Cl_2$), germane and gaseous hydrochloric acid (HCl)) can also be used for this "full wafer" deposition.

A succession of layers of semiconductor materials can also be formed by epitaxy between the layers of first and second semiconductor materials. Second semiconductor material $Sc_2$ can have a doped or intrinsic, relaxed or strained silicon, germanium, or silicon-germanium alloy base.

In a preferred embodiment, the first semiconductor material is made from silicon and the second semiconductor material is made from silicon-germanium. However, and independently from the semiconductor materials chosen, first semiconductor material $Sc_1$ is different from second semiconductor material $Sc_2$.

Figure 6:
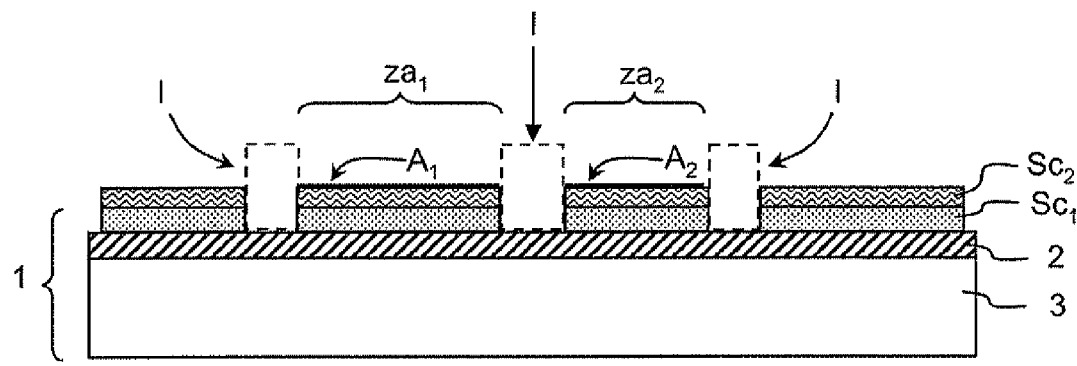

As illustrated in FIG. 6, at least two active areas $za_1$ and $za_2$ are formed at the surface of the substrate. The active areas are formed by etching of the substrate at the level of the layers of first and second semiconductor materials, which enables salient pads to be defined. In this step, the active areas comprise a layer of first semiconductor material $Sc_1$ covered by a layer of second semiconductor material $Sc_2$. The main surfaces of the two active areas $A_1$ and $A_2$ are thus formed by the same material, here second semiconductor material $Sc_2$. Main surface A of an active area is the free surface parallel to the surface of substrate 1. As the two main surfaces come from the same layer of second semiconductor material, they are in the same plane.

In a particular embodiment, first active area $za_1$ and second active area $za_2$ are separated by an insulating area I. The two active areas are thus adjacent and not touching.

In another embodiment, the two active areas are abutted and form a single pad. The pattern of the pads can be of any shape.

Figure 7:
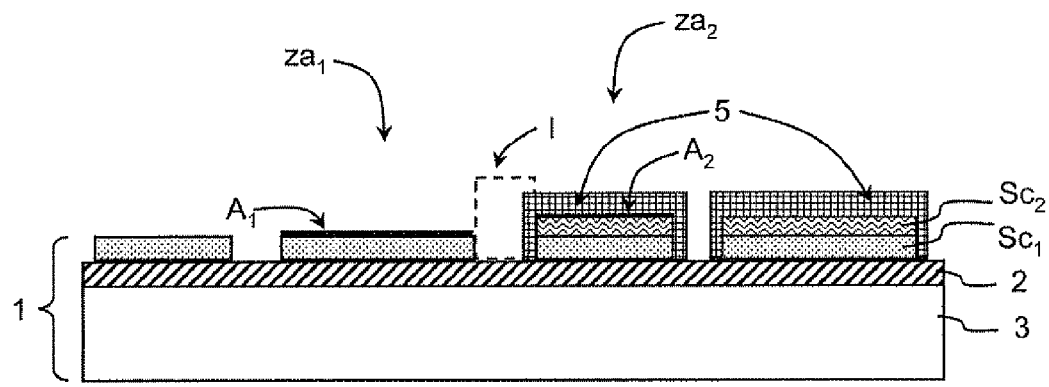

As illustrated in FIG. 7, second active area $za_2$ is then covered by a protective material 5. First active area $za_1$ is left uncovered. Then second semiconductor material $Sc_2$ is eliminated from uncovered first active area $za_1$. Protective material 5 is chosen so as to enable selective etching of second semiconductor material $Sc_2$ with respect to protective material 5 and preferably with respect to first semiconductor material $Sc_1$. For example purposes, the method for eliminating the second semiconductor material $Sc_2$ can be a method comprising a step of plasma etching in liquid phase or in gas phase. If semiconductor material $Sc_2$ is a silicon-germanium alloy and material $Sc_1$ is made from silicon, $CF_4$-base plasma etching, etching in liquid phase with a base of hydrofluoric acid solution, nitric acid and acetic acid diluted in deionized water, or thermal etching in gas phase using hydrochloric acid, can for example be used.

Protective material 5 can for example be formed by a silicon oxide ($SiO_2$) or a silicon nitride ($Si_3N_4$) or be based on a photosensitive material such as a resin.

Figure 8:
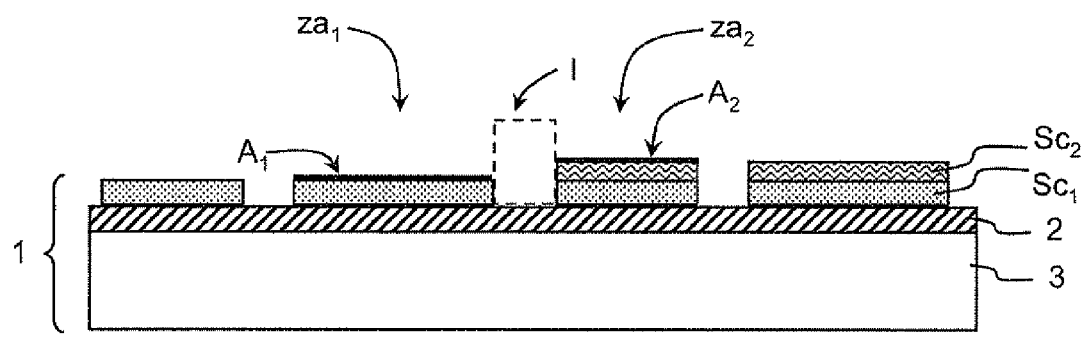

FIG. 8 illustrates the structure after elimination of the protective material 5 so as to release main surface $A_2$ of second active area $za_2$. If necessary, the materials covering second semiconductor material $Sc_2$ are also eliminated by means of conventional methods.

A first active area $za_1$ provided with a main surface $A_1$ made from first semiconductor material $Sc_1$ and a second active area $za_2$ provided with a main surface $A_2$ made from second semiconductor material $Sc_2$ are thus formed. The two active areas $za_1$ and $za_2$ are present at the surface of the substrate and laterally offset with respect to one another.

In advantageous manner, an insulating area I separates the two active areas. Insulating area I can be formed after differentiation of the two active areas by etching of a portion of the first and/or second active area to form two distinct and adjacent pads.

Figure 9:
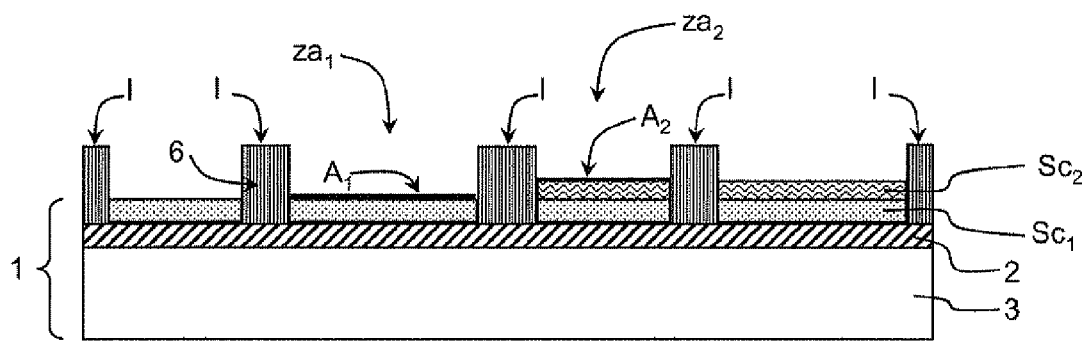

In another embodiment, insulating area I is formed when etching of the layers of first and second semiconductor materials is performed to define the salient pads of the structure illustrated in FIG. 6. The insulating area represents the space present between two pads. Insulating area I can be formed either by a void (FIG. 8) or by an electrically insulating material 6 deposited after active areas $za_1$ and $za_2$ have been structured as illustrated in FIG. 9. Electrically insulating material 6 can for example have a silicon oxide ($SiO_2$) or silicon nitride ($Si_3N_4$) base.

This fabrication method is particularly advantageous as the epitaxy step forming second semiconductor material $Sc_2$ is performed before etching of the substrate to delineate the active areas. It is thus possible to use a growth chemistry that is easier to control. It is also easier to find selective etching than selective epitaxy without crystallographic facets.

Figure 10:
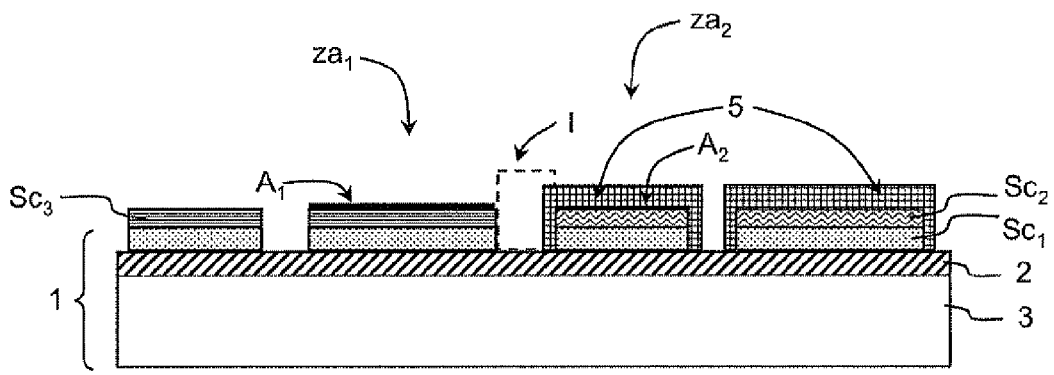
FIGS. 10 and 11 schematically represent, in cross-section, two substrates obtained from the substrate illustrated in FIG. 8.

According to a complementary embodiment and in order to obtain main surfaces $A_1$ and $A_2$ of the two active areas defining the same plane, a third semiconductor material $Sc_3$ is deposited on first active area $za_1$ made from first semiconductor material $Sc_1$. As illustrated in FIG. 10, this step can be performed before protective material 5 is eliminated from second active area $za_2$. Third semiconductor material $Sc_3$ can be identical to first semiconductor material $Sc_1$, but it can also be different. Third semiconductor material $Sc_3$ is preferably made from silicon. Positioning of third semiconductor material $Sc_3$ on first active area $za_1$ can be performed for example by means of selective epitaxy. If material $Sc_3$ is made from silicon, the charge effects will be minimized.

Another embodiment of the method also enables main surfaces $A_1$ and $A_2$ defining the same plane to be obtained by using "full wafer" deposition of material $Sc_3$. After $Sc_2/Sc_1$ bilayer has been formed on substrate 1, selective elimination of material $Sc_2$ is performed to define areas comprising a $Sc_2/Sc_1$ bilayer and areas with only the layer of material $Sc_1$. This elimination can be performed by means of a first photolithography followed by etching. Then the mask which was used for photolithography is eliminated and a layer of material $Sc_3$ is deposited full wafer. Layers of materials $Sc_2$ and $Sc_3$ have the same thickness. By means of a second photolithography, this time of opposite polarity from the first, followed by etching of material $Sc_3$, two active areas having main surfaces defining one and the same plane are defined. A first active area comprising a $Sc_2/Sc_1$ bilayer and a second active area comprising a $Sc_3/Sc_1$ bilayer.

Figure 11:
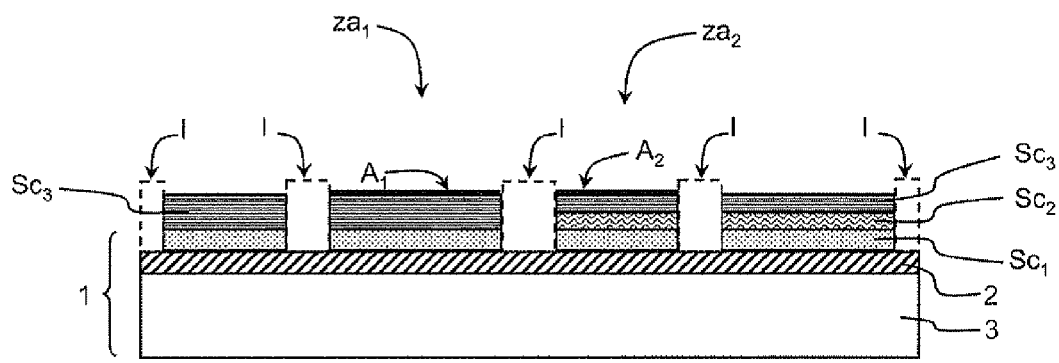

According to another embodiment, third semiconductor material $Sc_3$ can also be formed on active areas $za_1$ and $za_2$ after material 5 has been eliminated. As illustrated in FIG. 11, the substrate comprises a first active area $za_1$ comprising main surface $A_1$ made from third semiconductor material $Sc_3$. First active area $za_1$ comprises a layer made from first semiconductor material $Sc_1$ covered by a layer made from third semiconductor material $Sc_3$. The substrate also comprises a second active area $za_2$ comprising a main surface $A_2$ made from third semiconductor material $Sc_3$. Second active area $za_2$, comprises a layer made from second semiconductor material $Sc_2$ arranged between two layers of first $Sc_1$ and third $Sc_3$ semiconductor materials. The two active areas $za_1$ and $za_2$ can be separated by an insulating area I.

Third semiconductor material $Sc_3$ can be formed by any known means compatible with second semiconductor material $Sc_2$, for example by selective epitaxy. However, whatever the material and means used, semiconductor material $Sc_3$ has to be different from second semiconductor material $Sc_2$.

It can also be envisaged to deposit a trilayer $Sc_3/Sc_2/Sc_1$ directly on substrate 1, and to then perform successive eliminations of materials $Sc_3$ and $Sc_2$, followed by deposition of material $Sc_3$. The elimination steps can use photolithography steps with different sets of masks which will enable the structure illustrated in FIG. 11 to be obtained.

It is possible to combine the embodiment illustrated in FIG. 9 with that illustrated in FIG. 11 to obtain a particular embodiment which comprises first $za_1$ and second $za_2$ active areas having a main surface made from third semiconductor material $Sc_3$ and separated by an insulating pattern I.

Figure 12:
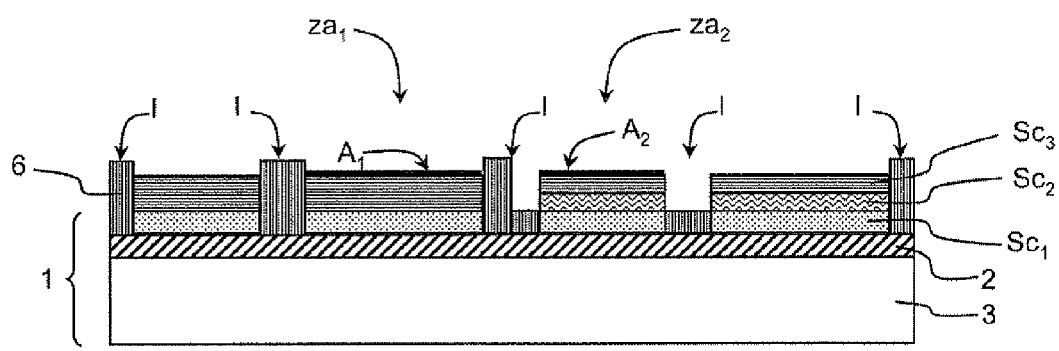
FIGS. 12 and 13, 14 and 15, 16 and 17 schematically represent, in cross-section, three embodiments of particular substrates obtained from the substrate of FIG. 11.

As illustrated in FIG. 12, from the previous particular embodiment, insulating pattern I is etched in proximity to second active area $za_2$ so as to laterally access the layer of second semiconductor material $Sc_2$. However, the part of insulating area I adjacent to first active area $za_1$ can subsist and continue to form an insulation for first active area $za_1$. Elimination of electrically insulating material 6 can be performed by any known means, for example using a photolithography step followed by chemical etching.

Figure 13:
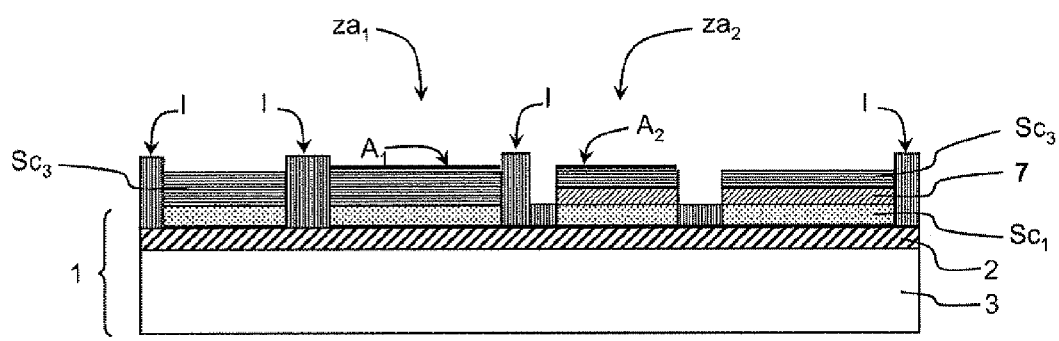

As illustrated in FIG. 13, second semiconductor material $Sc_2$ is then at least partially eliminated and an additional electrically insulating material 7 is deposited between the layer of first semiconductor material $Sc_1$ and the layer of third semiconductor material $Sc_3$. Additional electrically insulating material 7 can be of the same nature as insulating material 6 or have a base made from a different material. Additional electrically insulating material 7 can also be formed by a stack comprising at least one electrically insulating material. Advantageously, the base of additional electrically insulating material 7 is formed by an Oxide/Nitride/Oxide (ONO) stack. In the latter configuration, third semiconductor material $Sc_3$ is electrically insulated from first semiconductor material $Sc_1$ as in the SOI structure. The latter embodiment advantageously enables the thickness of the deposited electrically insulating material 7 to be controlled. Indeed, the thickness of the latter is defined by the thickness of the layer of second material $Sc_2$ deposited with precision by means of the "full wafer" epitaxy technique.

Location of the electrically insulating material 7 underneath third semiconductor material $Sc_3$ is performed in conventional manner. Layer $Sc_3$ has the same crystalline orientation as layer $Sc_1$.

Figure 14:
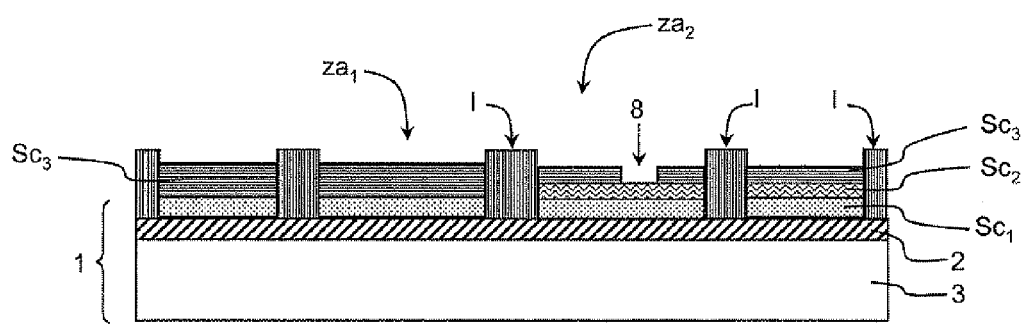
Figure 15:
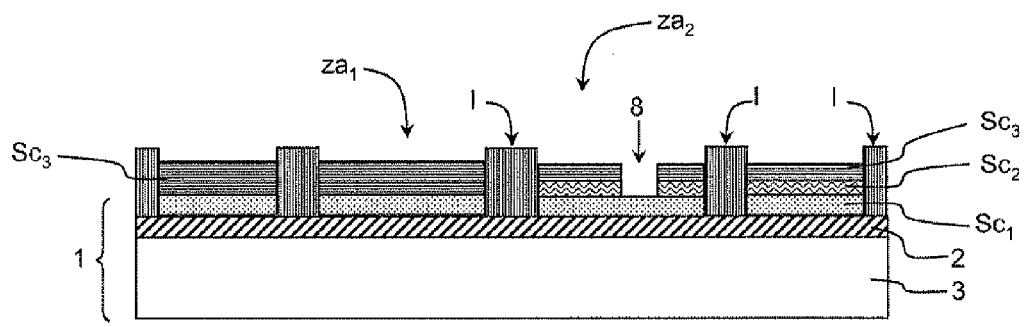

Another alternative embodiment enables a slightly different structure to be obtained. As illustrated in FIG. 14, from active area $za_2$ obtained by the method illustrated in FIG. 11, a hole 8 can be formed in the layer of third semiconductor material $Sc_3$. Formation of hole 8 can be performed by any known method of elimination of semiconductor and insulating materials, for example with techniques using photolithography and chemical etching steps. Hole 8 enables access to the layer of second semiconductor material $Sc_2$ located under the layer of third semiconductor material $Sc_3$. As illustrated in FIG. 15, hole 8 can also be extended in the layer of second semiconductor material $Sc_2$ so as to increase the accessible surface of the layer of second semiconductor material $Sc_2$.

In general manner, hole 8 is formed in second active area $za_2$ by making an opening in the semiconductor material of main surface $A_2$ so as to access second semiconductor material $Sc_2$.

Figure 16:
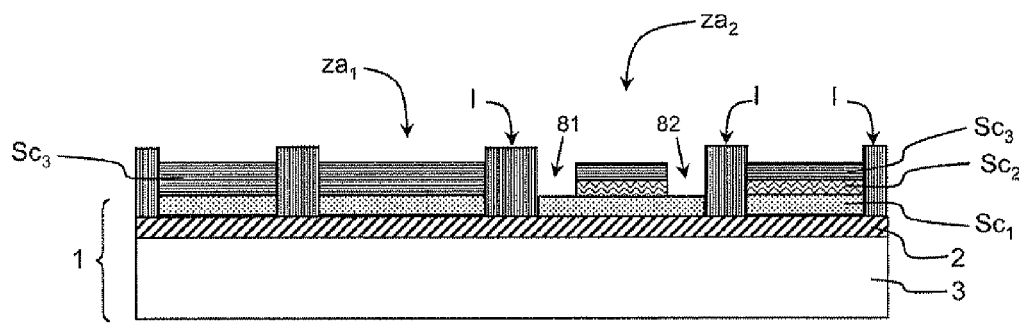

As illustrated in FIG. 16, two void areas, for example two trenches 81 and 82, can also be formed on each side of active area $za_2$. A gate electrode can be made on second active area $za_2$ before formation of trenches 81 and 82. The position of the gate electrode can also act as a mask and define trenches 81 and 82. The latter are formed in the layers of second $Sc_2$ and third $Sc_3$ semiconductor materials.

Figure 17:
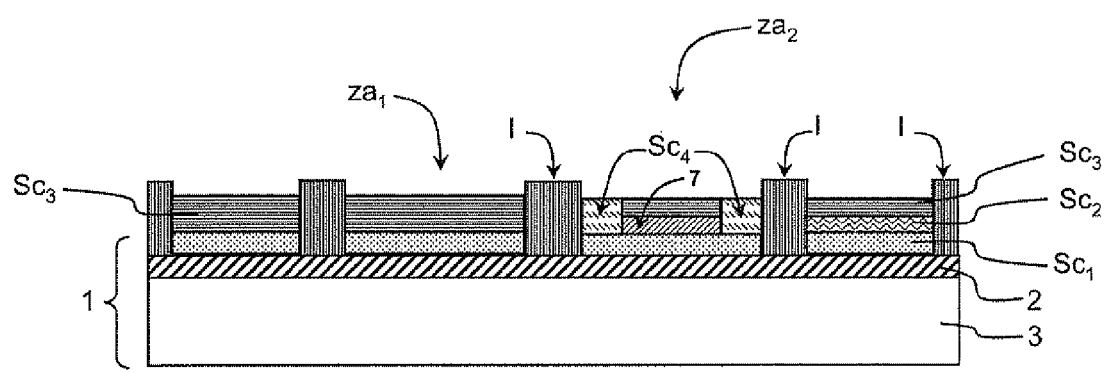

Then, as illustrated in FIG. 17, second semiconductor material $Sc_2$ is eliminated to form a void area under third semiconductor material $Sc_3$ in second active area $za_2$. The means for eliminating second semiconductor material $Sc_2$ are similar to those used in the previous embodiments. An electrically insulating material 7 is then deposited between the layer of first semiconductor material $Sc_1$ and the layer of third semiconductor material $Sc_3$ in the void area. Electrically insulating material 7 is preferably formed by an Oxide/Nitride/Oxide (ONO) stack. After formation of a gate electrode on second active area $za_2$, delineation of additional electrically insulating material 7 under this gate electrode can be performed. Deposition of an electrically conducting material on each side of additional electrically insulating material 7 is then performed.

According to this configuration, as illustrated in FIG. 17, deposition of semiconductor material $Sc_4$, can be performed so as to fill voids 81 and 82. Semiconductor material $Sc_4$ can be of the same nature as $Sc_1$, $Sc_2$, $Sc_3$ or be based on a different semiconductor material. Semiconductor materials $Sc_1$ and $Sc_4$ are preferably of the same nature. After voids 81 and 82 have been filled by semiconductor material $Sc_4$, these areas can be electrically connected to third semiconductor material $Sc_3$.

The above embodiments describe steps which enable formation of a first active area $za_1$ and second active area $za_2$ having different architectures.

However, the same embodiments can be applied in order to simultaneously form a plurality of first active areas and a plurality of second active areas. The above embodiments can also be used in combination in order to form a plurality of active areas having different surfaces and/or distributions. As the epitaxy step takes place full wafer, the charge effect phenomena are reduced or nil.

All the embodiments of the invention enable the use of selective epitaxy to deposit the second semiconductor material $Sc_2$ to be avoided. These embodiments consequently advantageously enable a homogeneity of the morphology of the active areas formed to be obtained. The thickness of the layer of second semiconductor material $Sc_2$ deposited is also controlled, which is beneficial for formation of active areas comprising buried insulating layers the thicknesses of which are controlled with precision.

The invention claimed is:

1. A method for fabricating a substrate comprising the following successive steps:
    providing a substrate with a layer made from a first semiconductor material;
    depositing by epitaxy, on the layer made from the first semiconductor material, of a layer made from a second semiconductor material different from the first semiconductor material;
    etching the substrate so as to define a first active area and a second active area separated from the first active area by a void, each active area comprising layers of the first and second semiconductor materials;
    leaving the first active area uncovered and covering the second active area with a protective material; and
    eliminating the layer made from the second semiconductor material of the first active area so as to obtain a main surface made from the first semiconductor material, the second active area comprising a main surface made from the second semiconductor material and comprising the layer made from the first semiconductor material.

2. The method according to claim 1, comprising depositing a third semiconductor material, different from the second semiconductor material, on the first and second active areas after the protective material has been eliminated from the second active area.

3. The method according to claim 1, comprising depositing of a third semiconductor material on the first active area before the protective material is eliminated from the second active area so as to have main surfaces of the first and second active areas in the same plane.

4. The method according to claim 1, comprising depositing an electrically insulating material on the void between the first and second active areas so as to form an insulating pattern.

5. The method according to claim 4, wherein the insulating pattern is etched so as to laterally access the layer made from the second semiconductor material of the second active area.

6. The method according to claim 2, comprising forming, in the second active area, of an open hole in the semiconductor material of the main surface so as to access the second semiconductor material.

7. The method according to claim 5, comprising:
    elimination of the layer of the second semiconductor material in the second active area to form a void area;
    deposition of an additional electrically insulating material in the void area.

8. The method according to claim 7, comprising:
    forming of a gate electrode on the second active area;
    defining of the additional electrically insulating material under the gate electrode; and
    depositing an electrically conducting material on each side of the additional electrically insulating material.

* * * * *